United States Patent [19]

Harima et al.

[11] Patent Number: 5,169,672
[45] Date of Patent: Dec. 8, 1992

[54] PROCESS FOR PRODUCING THIN FILMS AND COLOR FILTERS

[75] Inventors: Yutaka Harima; Kazuo Yamashita, both of Hiroshima; Seiichiro Yokoyama; Hideaki Kurata, both of Sodegaura, all of Japan

[73] Assignee: Idemitsu Kosan Co., Ltd., Tokyo, Japan

[21] Appl. No.: 643,779

[22] Filed: Jan. 22, 1991

[30] Foreign Application Priority Data

Jan. 30, 1990 [JP] Japan .................................. 2-17714

[51] Int. Cl.$^5$ .............................................. B05D 1/04
[52] U.S. Cl. .................................... 427/13; 427/53.1;
427/54.1; 427/108; 427/126.2; 427/126.3;
427/126.6; 427/294; 427/443.2
[58] Field of Search ................. 427/13, 53.1, 54.1,
427/108, 126.2, 126.3, 126.6, 294, 443.2

[56] References Cited

U.S. PATENT DOCUMENTS 3,989,731  11/1976  Talbot .

Primary Examiner—Bernard Pianalto
Attorney, Agent, or Firm—Frishauf, Holtz, Goodman & Woodward

[57] ABSTRACT

Disclosed is a process for producing thin films, which comprises dispersing or dissolving inorganic substance or hydrophobic organic substance in an aqueous medium in the presence of a surfactant having HLB value of 10 to 20, to obtain micelle solution or dispersion, dipping a semiconductive or photoconductive substrate into said micelle solution or dispersion, applying an electric potential on said substrate if necessary, and irradiating lights on the contact interface of said mecelle solution or dispersion and said substrate, and thus forming thin films of said inorganic substance or hydrophobic inorganic substance on said substrate.

Also disclosed is a process for producing color filters having excellent properties, which comprises forming color separation filter on the substrate according to the above-mentioned process, by the use of pigments or dyes in three primary colors of red, green, and blue.

10 Claims, 5 Drawing Sheets

PROCESS FOR PRODUCING THIN FILMS AND COLOR FILTERS

BACKGROUND OF THE INVENTION

1. Field of the Invention

The present invention relates to a process for producing thin films and color filters. More specifically, it is concerned with a process for producing thin films of various materials in prescribed positions on substrates accurately by means of merely irradiating lights with or without application of electric potentials; and a process for producing color filters whereby color filters can be efficiently formed by utilizing the above process for producing thin films.

2. Description of the Related Arts

Heretofore, for producing thin films, the vacuum deposition method, sputtering, and the plasma CVD method have been used, but these methods are poor in productivity or profitability since they require vacuum systems as well as large scale of equipments. The casting method and the dipping method require organic solvents, and are difficult in process control, and the resulting thin films are insufficient in homogeneity or smoothness in surface. According to so-called Micellar Disruption Method, moreover, it is able to form films in atmosphere, and thin films having excellent properties can be obtained, but, etching of ITO (mixed oxide of indium oxide and tin oxide) electrode and others are required for patterning, so further simplification is desired.

As the method of patterning thin films as above, a method of etching by the use of the pattern resist formed by photolithography is mainly used. However, said photolithography method is inpractical, since it has a number of complicated steps, is poor in productivity, and requires an expensive equipment.

Also in producing color filters, various precise operations such as the patterning of ITO electrode are required.

In this circumstances, the present inventors have repeated intensive studies in order to overcome the above disadvantages of the prior arts and to develop a process by which film producing and patterning are effected simultaneously in simple procedures.

SUMMARY OF THE INVENTION

As the result, it has been found that the above object can be attained by putting a semiconductive substrate or a photoconductive substrate into electrolyte to be used for the Micellar Disruption Method, and irradiating lights on it. The present invention has been accomplished basing upon such a finding.

The present invention provides a process for producing a thin film, which comprises putting a semiconductive substrate or a photoconductive substrate into a micellar solution or dispersion obtained by dispersing or dissolving an inorganic or hydrophobic organic substance, in an aqueous medium, in the presence of a surfactant having HLB (hydrophile-lipophile balance) value of 10 to 20; and irradiating lights on the surface of the substrate contacting with said micellar solution or dispersion to form thin films of said inorganic substance or hydrophobic organic substance on said substrate.

The present invention also provides a process for producing color filters, which comprises dispersing or dissolving a pigment or a dye having spectral characteristics of RGB (Red, Green and Blue) primary colors, each in aqueous medium, in the presence of a surfactant with HLB value of 10 to 20, to prepare a micellar solution or dispersion in each color; putting a semiconductive or photoconductive substrate successively into the micellar solution or dispersion in each color; and irradiating a light of prescribed patterns on the surface of the substrate contacting with said micellar solution or dispersion in each color while applying an electric potential of 1.0 to 3.0 V to said substrate, to form color separation filter on said substrate.

BRIEF DESCRIPTION OF DRAWINGS

FIGS. 3 (a) to (m) are explanatory views showing, in the order of the procedures, steps of the process for forming the black stripe obtained by the present invention.

DESCRIPTION OF PREFERRED EMBODIMENTS

The materials of the thin film to be used in the present invention are various and they are divided into the inorganic substances and the hydrophobic organic substances. Here, as the hydrophobic organic substances, various ones can be mentioned.

Examples of them are coloring matters for optical memory and organic coloring matters such as phthalocyanine, metal complexes of phthalocyanine, derivatives thereof, naphthalocyanine, metal complexes of naphthalocyanine, derivatives thereof, porphyrin, metal complexes of porphyrin and derivatives thereof, perylene, derivatives thereof, quinacridone, viologen, and Sudan; electrochromic materials such as 1,1'-diheptyl-4,4'-bipyridinium dibromide, and 1,1'-didodecyl-4,4'-bipyridinium dibromide; lightsensitive materials (photochromic materials) and light sensor materials such as 6-nitro-1,3,3-trimethylspiro-(2'H-1'-benzopyran-2,2'-indoline) (commonly called spiropyran); liquid crystal display coloring matters such as p-azoxyanisole. Further examples are the hydrophobic compounds among the coloring matters each for electronics, recording, lightsensitive chromism, photos, energy use, biomedicals, and coloring matters for foods and cosmetics, dyes, pigments, coloring matters for specific coloring which are listed in "Color Chemical Cyclopedia", CMC Co., Ltd., pp 542-717, Mar. 28, 1988. Moreover, other examples are electrically conductive organic materials and gas sensor materials such as the 1:1 complex of 7,7,8,8-tetracyanoquinonedimethane (TCNQ) and tetrathiafulvalene (TTF), light curing paints such as pentaerythritol diacrylate, insulating materials such as stearic acid, diazo-type light-sensitive materials and paints such as 1-phenylazo-2-naphthol. Still further examples are water-insoluble polymers, for example, general purpose polymers such as polycarbonate, polystyrene, polyethylene, polypropylene, polyamide, polyphenylene sulfide (PPS), polyphenylene oxide (PPO), polyacrylonitrile (PAN) and the like, polyphenylene, polypyrrole, polyaniline, polythiophene, acetyl cellulose, poly(vinyl acetate), poly(vinyl butyral), and various polymers (poly(vinyl pyridine) and the like) or copolymers (a copolymer of methyl methacrylate and methacrylic acid).

The inorganic substances include various ones including inorganic oxides and inorganic sulfides such as $TiO_2$, C, CdS, $Fe_2O_3$, $Y_2O_3$-$ZrO_2$, $ZrO_2$, $Al_2O_3$, CuS, ZnS, $TeO_2$, $LiNbO_3$, $Si_3N_4$, $SrCeO_3$, $WO_3$, PLZT (mixed oxide of Pb, La, Zr and Ti) and various kinds of superconductive oxides.

When color filters are prepared, among these various inorganic substances or hydrophobic organic substances, pigments or dyes having a spectral property of the three primary colors of RGB, that is, hydrophobic coloring matters of red, green and blue can be used.

As the red coloring matters, there may be mentioned a perylene type pigment, a lake pigment, an azo type pigment, a quinacridone type pigment, an anthraquinone type pigment, an anthracene type pigment, etc. For example, there may be mentioned a perylene pigment, a lake pigment (Ca, Ba, Sr and Mn), quinacridone, naphthol AS, a shikomin pigment, anthraquinone (Sudan I, II, III, R), disazo, benzopyrane, a cadmium sulfide type pigment, a Fe (III) oxide type pigment, etc. and among them, the perylene pigment and the lake pigment are preferred. Also, as the green coloring matters, there may be mentioned a halogen-poly-substituted phthalocyanine type pigment, a halogen-poly-substituted copper phthalocyanine type pigment or a triphenylmethane type basic dye, etc. For example, there may also be mentioned a chloro-poly-substituted phthalocyanine, its copper complex or a barium triphenylmethane dye, etc. As the blue coloring matters, there may be mentioned a copper phthalocyanine type pigment, an indanthrone type pigment, an indophenol type pigment or a cyanine type pigment, etc. For example, there may be mentioned phthalocyanine metal complexes such as chlorocopperphthalocyanine, chloroaluminumphthalocyanine, phthalocyanine vanadate, magnesium phthalocyanine, zinc phthalocyanine, iron phthalocyanine, cobalt phthalocyanine, etc; phthalocyanine, merocyanine, inodophenole blue, etc.

The shape and size of these inorganic substances or hydrophobic organic substances are not limited, but powder with a particle size of not more than 10 μm is preferably used.

Then, in the present invention, as aqueous medium used for formation of thin film, various media such as water, a mixture of water and alcohol, a mixture of water and acetone and so on can be mentioned.

The surfactant to be used in the present invention is that having HLB (hydrophile-liophile balance) of 10 to 20, more preferably 12 to 18. As said surfactant, those generally used may be mentioned, but those comprising forrocene derivatives are preferable.

Here, the ferrocene derivatives can include various ones, but for example, there may be mentioned the following seven kinds of (1) to (7).

Examples of such ferrocene derivatives include, (1) ferrocene derivatives in which a ferrocene compound (ferrocene or ferrocene derivative having a suitable substituent (e.g., an alkyl group, and an acetyl group)) is bonded to a cationic surfactant of the ammonium type (preferably the quaternary ammonium type) having a main chain with 4 to 16 carbon atoms (preferably 8 to 14). If the number of carbon atoms in the main chain is too small, no micelle is formed, and if it is too large, the resulting ferrocene derivatives are not soluble in water. The ferrocene compound is bonded to the surfactant in various embodiments. These embodiments are classified into three types (A), (B) and (C). Type (A) is an embodiment in which the ferrocene compound is bonded to the terminal of the main chain of the surfactant, type (B) is an embodiment in which the ferrocene compound is bonded to an intermediate point of the main chain, directly or through an alkyl group, and type (C) is an embodiment in which the ferrocene compound is incorporated in the main chain. Ferrocene derivatives of this ammonium type are represented by the general formula:

wherein $R^1$ and $R^2$ are each a hydrogen or an alkyl group having 1 to 4 carbon atoms (but not exceeding m as described hereinafter), Z and Z' are each a hydrogen or a substituent (methyl group, ethyl group, methoxy group or carbomethoxy group), X is a halogen, and m and n are integers satisfying the requirements: $m \geq 0$, $n \geq 0$, and $4 \leq m+n \leq 16$, the general formula:

wherein $R^1$, $R^2$, X, Z and Z' are the same as described above (provided that the number of carbon atoms of $R^1$ and $R^2$ does not exceed h as described hereinafter), and h, j and k are integers satisfying the requirements: $h \geq 0$, $j \geq 0$, $k \geq 1$ and $3 \leq h+j+K \leq 15$ and p is an integer satisfying the requirement: $0 \leq p \leq k-1$, the general formula:

wherein $R^1$, $R^2$, X, Y, Z and Z' are the same as described above (provided that the number of carbon atoms of $R^1$ and $R^2$ does not exceed r as described hereinafter), and r, s and t are integers satisfying the requirements: $r \geq 0$, $s \geq 0$, $t \geq 1$, and $4 \leq r+s+t \leq 16$, or the general formula:

wherein $R^1$, $R^2$, X, Y, Z, Z', r, s and t are the same as described above.

Next, as (2) the ferrocene derivatives of other type, there may be mentioned ferrocene derivatives of ether type represented by the general formula:

In the formula, a is an integer of 2 to 18, and b is a real number of 2.0 to 100.0. Since a is an integer of 2 to 18 as described above, an alkylene group having 2 to 18 carbon atoms such as an ethylene group, a propylene group, etc. is interposed between the carbon atoms in the ring and Y. Also, b is not only an integer of 2.0 to 100.0, but also a real number containing these, and represents an average value of of recurring numbers of the oxyethylene group (—CH$_2$CH$_2$O—) constituting the ferrocene derivative. Y in the above general formula represents an oxygen (—O—) or an oxycarbonyl group and Z and Z' are each a hydrogen or substituent as described above.

These ferrocene derivatives of ether type can be prepared according to the method and the like described in the specification of International Patent Application WO 89/01939.

Further, as (3) the ferrocene derivatives of other type, there may be mentioned ferrocene derivatives of pyridinium type represented by the general formula:

In the formula, Z, Z' and X are the same as described above, $R^3$ is an alkyl group having 1 to 4 carbon atom, an alkoxy group having 1 to 4 carbon atoms, a carboalkoxy group having 1 to 5 carbon atoms, a hydroxyl group, carboxyl group, or sulfonic acid group. $C_eH_{2e}$ represents a straight or a branched alkylene group having 1 to 16 carbon atoms. Specific examples of $C_4H_{2e}$ are a straight alkylene group including a polymethylene group $(CH_2)_e$ such as a tetramentylene group, a pentamethylene group, an octamethylene group, an undecamethylene group, a dodecamethylene group, a hexadecamethylene group, etc. or a branched alkylene group such as 2-methylundecamethylene group, 4-ethylundecamethylene group, etc.

These ferrocene derivatives of pyridinium type can be prepared according to the methods and the like described in Japanese Patent Application Laid-Open No. 226894/1989.

Another type of ferrocene derivatives (4) are those represented by the general formula:

wherein $R^4$ and $R^5$ are each a straight chain or a branched chain alkylene group having 1 to 14 carbon-atoms, $X^1$ and $X^2$ are each

$A^1$ and $A^2$ are each

(R' is a hydrogen or a methyl group, and q is a real number of 2 to 70), $Z^1$ and $Z^2$ are each a hydrogen, a methyl group, a methoxyl group, an amino group, a dimethylamino group, a hydroxyl group, an acetylamino group, a carboxyl group, a methoxycarbonyl group, an acetoxyl group, an aldehyde group or a halogen, c and d are each an integer of 1 to 4.

These ferrocene derivatives can be produced according to the process described in the specification of Japanese Patent Application Laid-Open No. 83387/1990, for instance.

Another type of ferrocene derivatives (5) are represented by the general formula:

wherein X is and Z indicates

G indicates a hydrogen, a methyl group or an ethyl group, $R^1$ and $R^2$ are each H, $NH_2$, $H(CH_3)_2$, $CH_3$, $CH_3O$, OH or a halogen, and $R^3$ is a hydrogen or a methyl group, n is an integer of 0 to 10, r is a real number of 2 to 70, a and b are each an integer of 1 to 4. These ferrocene derivatives can be produced according to the process described in the specification of Japanese Patent Application Laid-Open No. 45370/1989.

Still another type of ferrocene derivatives (6) are represented by the general formula:

wherein $Z^1$ and $Z^2$ are each H, $CH_3$, $CH_3O$, $NHCOCH_3$, $N(CH_3)_2$, $COCH_3$, $COOCH_3$ or a halogen, X is -continued

(r is an integer of 0 to 3), Y is and R is a hydrogen or a methyl group; k is a real number of 2 to 70, h is an integer of 2 to 18, m is an integer of 0 to 4, n indicates 1 or 2, and a and b are each an integer of 1 to 4.

These ferrocene derivatives can be produced according to the process described in the specification of Japanese Patent application Laid-Open No. 96585/1990.

Another type of ferrocene derivatives (7) are represented by the general formula:

wherein
$R^1$ and $R^2$ are each a hydrogen, a methyl group, a methoxyl group, an amino group, a dimethylamino group, a hydroxyl group or a halogen,
X is here, M is an alkali metal or an alkali earth metal, a is an integer of 1 to 4, b is an integer of 1 to 5, k is an integer of 1 to 18 and m is an integer of 0 to 4.

There ferrocene derivatives can be produced according to the process described in the specification of Japanese Patent Application Laid-Open No. 250892/1990.

In the process of the present invention, it is preferable to use at least one compound of the above ferrocene derivatives appropriately as a surfactant. Further, other surfactants can be used with these ferrocene derivatives or in place of these derivatives. These surfactants includes various ones, but those whose HLB value is in the range of 10 to 20 (when used with ferrocene derivatives, average of both HLB values is in the range of 10 to 20) should be used. Preferable examples of these surfactants are nonionic surfactants such as polyoxyethylenealkylether, polyoxyethylene fatty acid ester, polyoxyethylenealkylphenylether, polyoxyethylenepolyoxypropylene alkylether. In addition, cationic or anionic surfactant such as alkyl sulfate, polyoxyethylenalkylether sulfate, alkyltrimethylammonium chloride, fatty acid diethylaminoethylamide.

In the process of the present invention, the above surfactants and inorganic substances and/or hydrophobic organic substances are first placed in an aqueous medium and thoroughly stirred by the use of mechanical homogenizer, supersonic homogenizer, pearl mill, sand mill, stirrer, or three rolls mill.

Inorganic substances or hydrophobic organic substances can be dispersed or solubilized with the surfactant, to be a dispersion or a solution.

The concentration of the surfactant in that process is not critical, but the surfactant including the above ferrocene derivative may be usually a threshold micelle concentration or higher, preferably in the range of 10 $\mu$M to 0.1 M, preferably 0.5 mM to 5 mM.

In the process of the present invention, the supporting salt (supporting electrolyte) is added, if necessary, in order to control the electrical conductance of the aqueous medium. The amount of the supporting salt added is not critical as long as it does not inhibit the deposition of the coloring matters dissolved or dispersed in the solution, but usually about 0 to 300 times and preferably about 50 to 200 times that of the above micelle forming agent. Said supporting salt is not necessarily inevitable to electrotreatment. Without it, a thin film of high purity containing no supporting salt can be obtained. The type of supporting salt is not critical as long as it is able to control the electric conductance for the aqueous medium without inhibiting the deposition of the above coloring matters onto the electrode.

Preferred examples of the supporting salts therein are specifically, sulfuric acid salts (salts of lithium, potassium, sodium, rubidium, aluminum and the like), acetic acid salts (salts of lithium, potassium, sodium, rubidium, beryllium, magnesium, calcium, strontium, barium, aluminum and the like), salts of halide (salts of lithium, potassium, sodium, rubidium, calcium, magnesium, aluminum and the like), salts of water soluble oxides (salts of lithium, potassium, sodium, rubidium, calcium, magnesium, aluminum and the like) which are generally and widely used as supporting salts.

In the process of the present invention, it is necessary to put (dip) a semiconductive (photosemiconductive) substrate or photoconductive substrate into the micelle solution or dispersion thus prepared. Said semiconductive substrate or photoconductive substrate can be dipped in the course of preparing the above-mentioned micelle solution or dispersion, but usually it can be dipped after preparation.

Herein the semiconductive substrate or photoconductive substrate to be dipped may be either of n-type or p-type, but preferred is n-type. When a semiconductive substrate or photoconductive substrate of p-type is used, it is preferred that the substrate is provided with a layer of a substance which can be the blocking joint between said substrate and the solution.

These semiconductive or photoconductive substances of n-type include various ones, preferred examples of which are specifically, $TiO_2$, $ZnO$, $CdS$, $SnO_2$, $SiC$, a-Si (amorphous), $CdSe$, $GaP$, $GaAs$, $Si$ and $Ge$, and also sensitizers such as cyanine, hydroquinone, piperidine, Rose Bengal, eosine, rhodamine B, and fluorescein can be added or laminated.

Semiconductive or photoconductive substances of p-type are not limited particularly, but inorganic semiconductive substances such as $Si$, $SiC$, $InP$, $GaSb$, and $GaP$ are preferable. Further, as the substances to be the blocking joint of said semiconductive or photoconductive substance of p-type, the substances having smaller work function than those of said semiconductive or photoconductive substance of p-type, such as ITO (mixed oxide of indium oxide and tin oxide) can be mentioned.

The principle of the process of the present invention is not necessarily clear, but is assumed as follows. When semiconductive or photoconductive substance of n-type is used, the blocking (rectification) contact generated on the interface of the semiconductive or photoconductive substance of n-type and the solution is utilized. The proton absorbed in the depletion layer by irradiation of light forms a pair of electron and positive hole. It is considered that the resulting electrons transfer to the electrode in ohmic contact with the semiconductive substance and the like by the bending in energy band, while the positive hole having a high oxidizing ability oxidize the surfactant in the solution.

When a p-type semiconductive or photoconductive substance is used, the blocking contact of the p-type semiconductive or photoconductive substance with the electrode is utilized. Therein, the electromotive voltage by irradiation of light is generated mainly on the interface of the electrode and the semiconductive substance. The positive hole generated by light irradiation is considered to pass through the semiconductive bulk, to oxidize the surfactant in the solution.

In the process of the present invention, after the semiconductive or photoconductive substrate is dipped in the above-mentioned micelle solution or dispersion, a light irradiation onto the contact face of said micelle solution or dispersion and said substrate (usually the surface of the substrate in contact) is required. Herein the light to be irradiated is visible light, ultraviolet light and the like. As to the source and energy of light, for example, a light energy of 20 to 5000 mJ/cm$^2$ is irradiated for 1 to 150 minutes by the use of a high-pressure mercury-vapor lump of 2 kW. By irradiation for 60 seconds by the use of a high-pressure mercury-vapor lump of 500 W, a thin film of approximately 0.6 $\mu$m in thickness (however, it varies with the material for thin films or the like) is formed. The thickness of the thin film to be formed is generally proportional to potential (electric potential) and to period of light irradiation, and the potential and the period of irradiation can be appropriately determined according to the desired film thickness.

The semiconductive or photoconductive substrate to be used in the process of the present invention can be prepared by forming a transparent electrode on a transparent substrate, and then forming a layer of semiconductive or photoconductive substance on the transparent electrode. Herein the substrate is preferably glass substrate made of blue plate glass, white plate glass, alkali-free glass (e.g., 7059, produced by Corning Glass Works, NA45 produced by HOYA Co., Ltd.), low-expansion glass, or quarts glass. The material of the transparent electrode is sufficient if it is a metal more noble than the oxidation-reduction potential ($+0.15$ to $0.30$ V against saturated calomel electrode) of the ferrocene derivative or an electroconductive substance. Specific example of them are ITO (mixed oxide of indium oxide and tin oxide), tin dioxide, and electroconductive polymer film.

In order to increase the effect of light irradiation, it is preferred to apply electric potential previously to the substrate to make such circumstances as photocurrent is easily pass. The electrical potential varies with the circumstances, and cannot be determined unconditionally. For example, an electric potential of 1.0 to 3.0 V, preferably 1.0 to 1.8 V (against saturated calomel electrode (SCE)) is applied to the substrate. Or in other circumstances, an electric potential of −0.2 to 1.0 V against SCE is preferably applied.

To form thin films of hydrophobic coloring matters of the primary colors, which constitute the color filter, either one of red, green and blue of hydrophobic coloring matters is added in aqueous medium, to form thin films of desired color tone in a desired pattern according to the above procedure, and then the above procedures are repeated with other kinds of hydrophobic coloring matters. Besides the hydrophobic coloring matters of the primary colors (red, green, blue), when above procedures are repeated for other hydrophobic coloring matters of one or more colors, thin film of the other color can be formed on each transparent electrode. If hydrophobic coloring matters of red, green, and blue are simultaneously present in aqueous medium, and the Micellar Disruption Method is carried out, then the color display material or the color filter of the present invention can be also produced.

Figure 1:
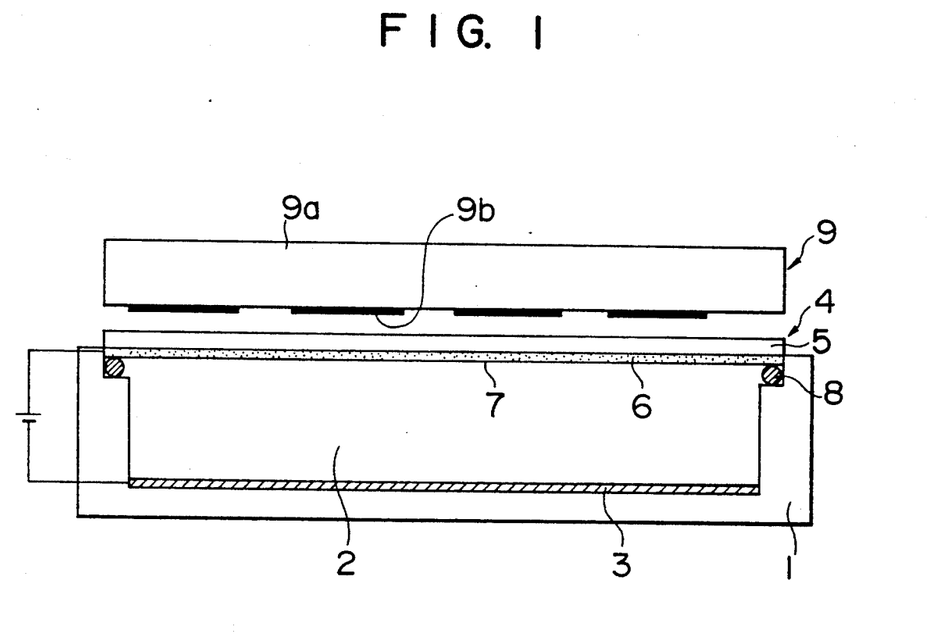
FIG. 1 is a cross-sectional view illustrating the structure of the equipment for carrying out the process of the present invention.

Here, the procedures for producing color filters are described with reference to FIGS. 1 and 2.

In the figures, 1 is a cell, which contains micelle solution or dispersion 2, and provided with an counter electrode 3 on the bottom.

The semiconductive or photoconductive substrate 4 is produced by forming transparent electrode 6 such as ITO on said transparent substrate 5 composed of glass and the like, and further on it, by forming thin film 7 of said semiconductive or photoconductive substance.

The above-mentioned semiconductive or photoconductive substrate 4 can be produced by the ordinary procedure. On the glass substrate, the surface of which is polished and washed by polishing and ultrasonic washing, to be dried by hot air, and further UV washed by UV washer and ozonizer, an transparent electrode made of ITO, for instance, is formed by means of vacuum deposition method, sputtering method, or pyrosol method, and further on it, thin film of semiconductive or photoconductive substance such as $TiO_2$ thin film is formed by the vacuum deposition method, sputtering method, Ti-oxidizing method, or dip-sintering method.

Said semiconductive or photoconductive substrate 4 is fixed interposing O-ring 8 to cell 1 containing micelle solution or dispersion 2 containing the desired coloring matters, so that the thin film 7 of semiconductive or photoconductive substance may contact the solution. Therein, it should be noted that any bubble may not go into the inside.

Figure 2:
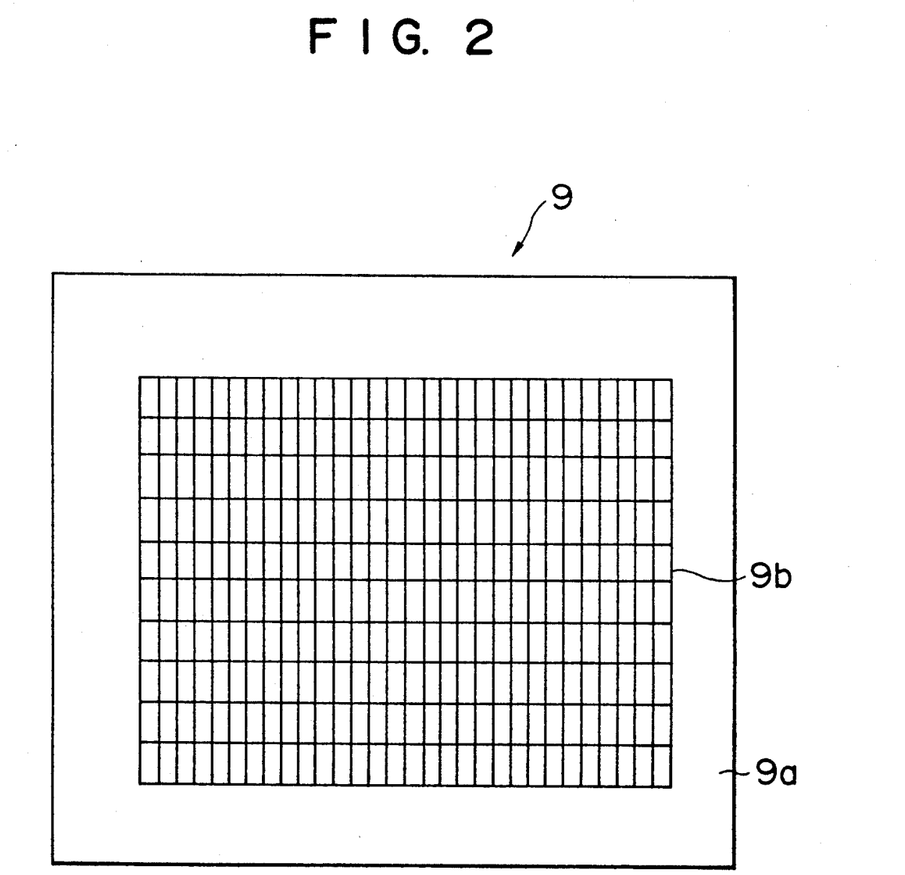
FIG. 2 is the front view illustrating an example of the mask to be used in producing color filters.

Subsequently, between the taken-out electrodes provided previously to said counter electrode 3 and the transparent electrode 6, an electric potential in the above mentioned range is applied, and mask 9 of the prescribed pattern as shown in FIG. 2 is arranged on the back of substrate 4, and light is irradiated by means of high-pressure mercury-vapor lump and the like from the back.

Mask 9 shown in FIG. 2 is made by forming dot pattern 9b of 310 μm in length, 90 μm in width, having gaps of 20 μm (the black stripe portion in the drawing) on the quartz glass substrate 9a. In drawing, the black stripe part of the figure shows the part for transmitting and the rest shows the mask part in black.

Therein, $TiO_2$ and the like is insulator. Accordingly, if electric potential is applied previously, there passes no electric current so that no film can be formed in that condition. It is only when light irradiation is conducted that electric current passes and films corresponding to the pattern of the mask are formed.

Next, the substrate 4, with which films have been formed as above, is fixed to the cell containing micelle solution or dispersion containing another coloring matter, an the position of mask 9 is changed to the prescribed position and films are formed by applying electric potential and light irradiation in the same way as the above.

By repeating such procedures for forming films for each color of RGB, and MB(black matrix), if necessary, films in RGB of desired patterns can be formed.

As described above, according to the process of the present invention, desired thin films having been patterned accurately can be formed optionally, and etching and the like are not required. Since no electric treatment is required, the operation and equipment are very simple, and pattern design is not limited because taken-out part of electrode is not necessary.

Moreover, desired thin film having been precisely patterned, and particularly, thin films of various materials, can be optionally formed at desired position. Said thin films of various materials can be formed by repeating the procedures for forming films by use of various materials for thin films.

Further, since patterning is not required, the process of etching can be omitted, and island-type color filter (e.g., mosaic) which has been regarded as difficult by electrodeposition, can be formed. In addition, heat resistance of thin film is not required, either. Furthermore, the thin film possesses electric conductivity as in the Micellar Disruption Method, so driving of liquid crystal is free from any load. And also BM can be formed in the same way, so smooth color filter can be obtained.

According to the process of the present invention, excellent color filter, printing plate, photomask, black stripe and the like can be formed. The color filters to be produced by the process of the present invention can be utilized, for example, for various displaying devices such as liquid crystal display devices, electrochromic display devices, latitude display devices, plasma displaying panels, spectroscopic devices, solid-state photographing devices, and dimmers and also for filters. More specifically, they are utilized effectively in the field of lap top-type personal computers, word processors, work stations, aurora visions, liquid crystal projectors, liquid crystal color TVs, liquid crystal color filters, color tone glasses, overhead projectors (OHP), internal panel loaded on cars and machinery monitors.

Various methods are taken for forming the above black stripes, but usually the course of steps as under is preferred. An example of said process is described basing on FIG. 3.

(1) FIG. 3 (a)

Figures 3A, 3B, 3C, 3D, 3E, 3H, 3I, 3J, 3K:
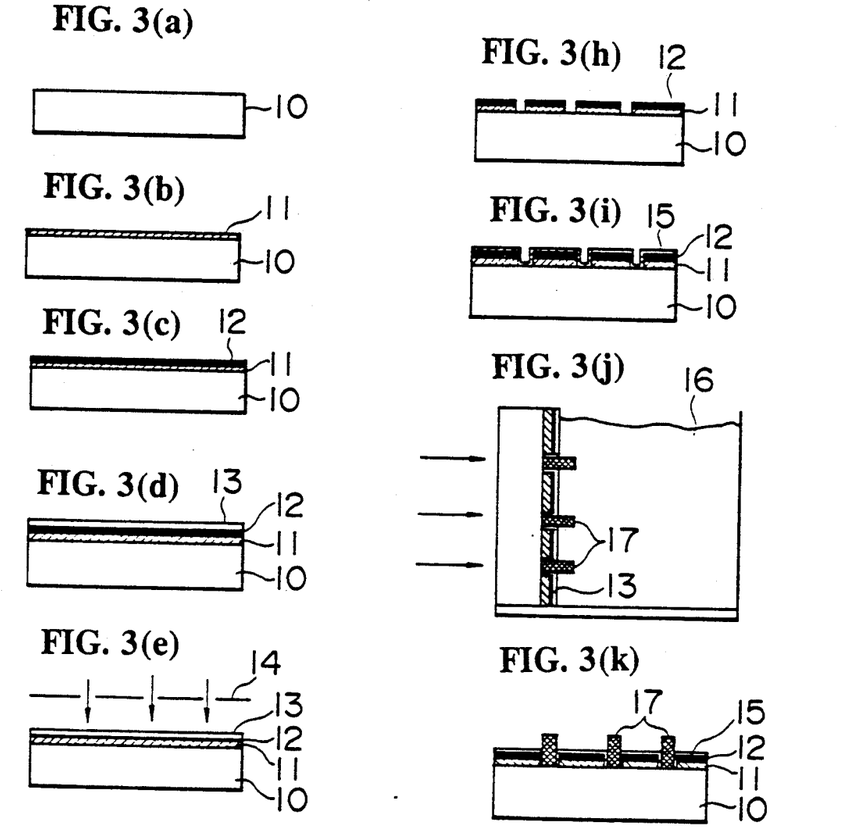

First, substrate 10, on which black stripes are to be formed, is prepared. As said substrate 10, various substances can be used depending on the purpose of the products on which black stripes have been formed, but generally, glasses such as white plate glass, blue plate glass, alkali-free glass, and borosilicate are used. The thickness of substrate 10 can be selected optionally.

(2) FIG. 3 (b)

On substrate 10, ITO (mixed oxide of indium oxide and tin oxide) thin film 11 is formed. Said ITO thin film 11 may be formed by conventional methods including those for vacuum deposition films, sputtering films, sol-gel films, EB films, and Pyrosol ITO films. The film thickness is usually 500 to 2000 Å, and may have a surface resistance of 10 to 200 Ω/□.

(3) FIG. 3 (c)

Metal mask layer 12 is formed on said ITO thin film 11. Said metal mask layer 12 is formed of chrome, nickel or the like in the thickness of several μm, which can be made by ordinary vacuum deposition methods.

(4) FIG. 3 (d)

Further on said metal mask layer 12, resisting agent 13 is applied. As said resisting agent 4, cyclorubber-based resisting agent, acryl-based resisting agent and the like of either negative-type or positive-type can be used.

(5) FIG. 3 (e)

Subsequently, the substrate is subjected to exposure by the use of a mask with the prescribed stripe pattern formed on it. Said exposure can be effected by one-shot exposure, step exposure, or exposure by a stepper, with the use of usual light source.

(6) FIG. 3 (f)

Figure 3F:
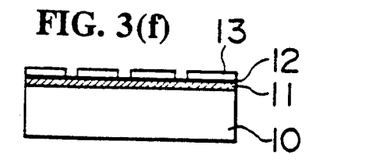

When development treatment is effected after said exposure, resisting agent only is developed. Said development treatment can be carried out according to the ordinary method.

(7) FIG. 3 (g)

Figure 3G:
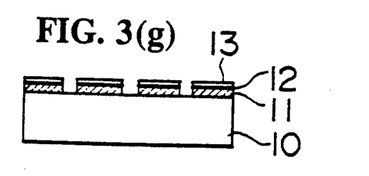

After development, etching is effected, that is, metal mask layer 12 and ITO layer 11 are simultaneously subjected to etching. As the etching solution therein, a mixture of HCl, HNO$_3$, Ce(NO$_3$)$_4$, and FeCl$_3$, in the blending ratio of 1:0 to 1:1 to 2:1 to 2, respectively can be used. The treatment can be conducted at room temperature to 60° C., for 10 to 50 minutes.

(8) FIG. 3 (h)

Subsequently, resisting agent 13 is removed. The resiting agent 13 can be removed with aqueous solution of sodium hydroxide, for instance.

(9) FIG. 3 (i)

After resisting agent 4 is removed, thin film 15 of beforementioned p- or n-type semiconductive or p- or n-type photoconductive substance is formed. The examples of the methods for forming thin film 15 of the semiconductive or photoconductive substance are the vacuum deposition method, sputtering, sol-gel film method, EB film method, and Pyrosol ITO film method.

In said thin film 6, further, a dopant can be doped. For example, Nb can be doped in TiO$_2$. The film thickness varies depending on the kinds of films. In TiO$_2$ film, for instance, it is preferable 100 to 5000 Å. Either of steps (1) to (9) heretofore can be performed according to the conventional methods.

(10) FIG. 3 (j)

Then, the substrate composed of semiconductive or photoconductive substance obtained as above is dipped into the dispersion or micelle solution 16 in which blackening pigment has been dispersed or dissolved, and subjected to light irradiation, to form black stripe 17 by the photomicelle method.

(11) FIG. 3 (k)

The resulting substrate with black stripes is washed and dried. This step is effected as, for example, the substrate is washed with pure water, and washed with ultrasonic wave, and then drained by a spin drier, and dried at 70° to 80° C. for 2 hours.

(12) FIG. 3 (l)

Figure 3L:
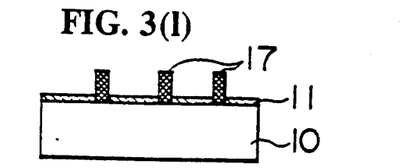

The substrate with black stripes after washed and dried is subjected to lift-off-etching, and thus the etching of metal mask layer 12 and thin film 15 of semiconductive or photoconductive substance is effected. As the etching solution to be used there, the same solution as in FIG. 3 (g) can be used. In this way, black stripes having no conductivity and having a thickness as small as 0.6 to 0.9 μm can be formed.

(13) FIG. 3 (m)

Figure 3M:
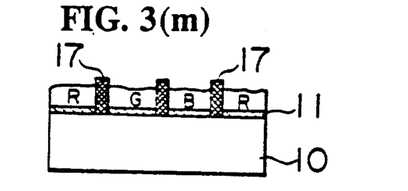

Lastly, when each thin film of RGB is formed at the prescribed position by the Micellar Disruption Method, for instance, then a color filter comprising black stripes with the best film thickness balance and RGB film can be obtained.

As shown above, in the present invention, photolithography is effected only one time, and black stripes can be formed by self-alignment. Black stripes can be formed before formation of RGB film.

The present invention is described in greater detail with reference to following Examples.

EXAMPLE 1

Figure 4:
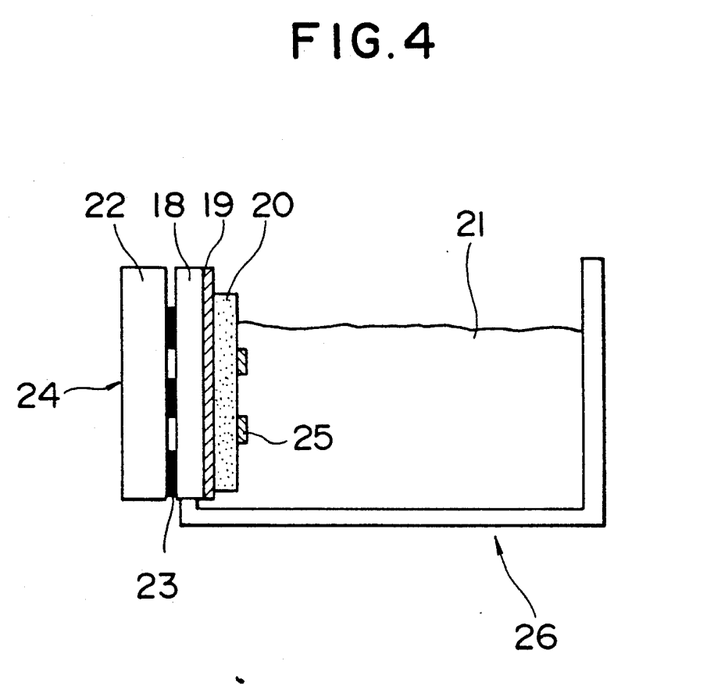
FIG. 4 is an explanatory view of the equipment used in Examples 1 to 6.

In a container 16 shown in FIG. 4, 50 cc of water and a compound (FPEG) represented by the formula:

were added, to make the concentration of 1 mM. To the resulting micelle solution 21, 0.2 g of phthalocyanine was added, and 0.1M of LiBr as the supporting salt was added, and the mixture was stirred by a stirrer for two days. An n-type semiconductive transparent substrate, which was produced previously by vacuum deposition of TiO$_2$ layer 20 of 5000 Å on ITO substrate (thin film) 19 of 20 Ω, was dipped in the resulting solution, and then a voltage of 0.5 V (against SCE) was applied to the ITO, ultraviolet ray 24 was condensed with lens by the use of a high-pressure mercury-vapor light of 500 W, and then the condensed light was irradiated on the substrate for 60 seconds from the side of photomask 22. Therein, the upper part of ITO was covered with semiconductor such as TiO$_2$, so micelle disruption was not caused, but only the portion which had received the light irradiation was formed to film.

Figure 5:
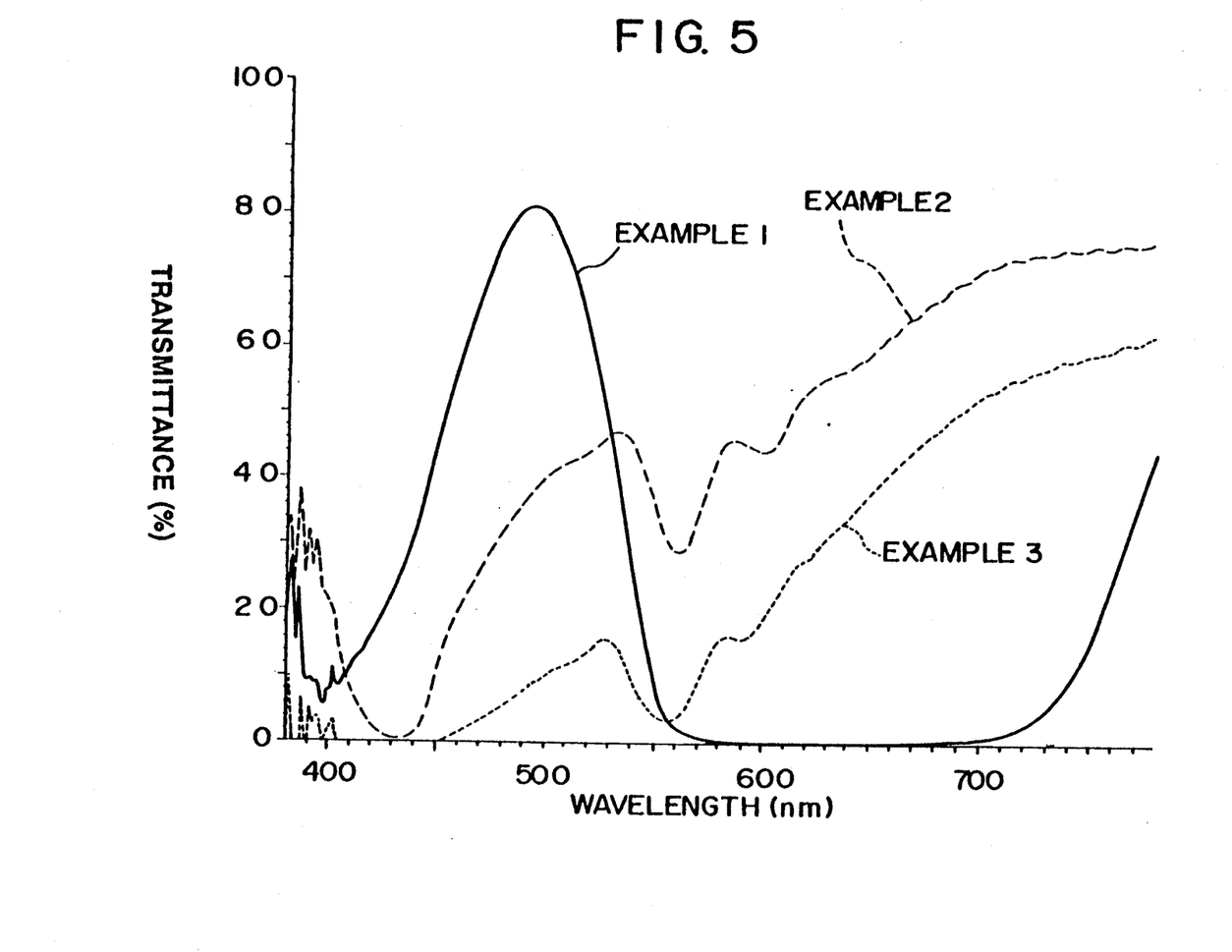
FIG. 5 shows the visible absorption spectrums of the thin film formed in Examples 1 to 3.

In this manner, a patterned thin film 25 of phthalocyanine was obtained. The visible ray absorption spectrum of said thin film is shown in FIG. 5.

EXAMPLE 2

The procedure of Example 1 was repeated except that zinc complex of tetraphenylporphyrin (ZnTPP) was used in place of phthalocyanine. The visible ray absorption spectrum of the thin film is shown in FIG. 5.

EXAMPLE 3

The procedure of Example 2 was repeated except that the period of light irradiation as 120 seconds instead of 60 seconds. The visible ray absorption spectrum of the thin film is shown in FIG. 5.

EXAMPLE 4

The procedure of Example 1 was repeated except that Brij 35 (produced by KAO Co., Ltd.) of 2 mM was used in place of FPEG, and that the period of irradiation was 40 minutes instead of 60 seconds. In this manner, a patterned thin film as in Example 1 was obtained.

EXAMPLE 5

The procedure of Example 1 was repeated except that copper phthalocyanine was used in place of phthalocyanine, that the concentration of FPEG was 2 mM instead of 1 mM, that the period of irradiation was 15 minutes instead of 60 seconds, and that no supporting electrolyte was used. In this way, a patterned thin film as in Example 1 was obtained.

EXAMPLE 6

The procedure of Example 1 was repeated except that phthalocyanine green was used in place of phthalocyanine, that the period of irradiation was 40 minutes instead of 60 seconds, that no supporting electrolyte was used, and that the potential to apply was 0 V instead of 0.5 V against SCE.

In this way, a patterned thin film as in Example 1 was obtained.

EXAMPLE 7

The procedure of Example 1 was repeated except that ZnO was used in place of $TiO_2$. In this way, a patterned thin film as in Example 1 was obtained.

EXAMPLE 8

On ITO substrate of 300 square produced on a blue plate glass of 1.1 mm in thickness so that the ITO film has a face resistance of 20 $\Omega/cm^2$, $TiO_2$ thin film was formed by the vacuum deposition method. $TiO_2$ used in vacuum deposition was crystalline rutile with purity of 99.9% (produced by Wako Junyaku Industry Co., Ltd.), and the heat board made of tangsten was heated to 2000° C. The film thickness was measured by a quartz vibration-type film-thickness meter (CRTIA: produced by ULVAC Co., Ltd.), to be 5000 Å. In this way, $TiO_2$/ITO substrate was obtained.

To 4 L (L=liter) of pure water, FPEG (produced by Dozin Chemical Co., Ltd.) and Cromophtal A2B (produced by Ciba Geigy Co., Ltd.) was added, to make solutions so that the concentrations of them may be 2 mM and 10 g/liter, respectively, and dispersed for 30 minutes by the use of ultrasonic homogenizer, to make a micelle dispersion. Said micelle dispersion was put in a cell of the same shape as shown in FIG. 1, and above-mentioned $TiO_2$/ITO substrate was fixed to the cell so that any bubble comes into it. On said $TiO_2$/ITO substrate, taken-out electrodes were set previously, and a voltage of 1.5 V against SCE was applied.

Subsequently, on the back (upper surface) of said $TiO_2$/ITO substrate, with a proximity gap of 70 μm, of the similar shape as shown in FIG. 2, a mask of dot pattern with a picture element size of 90 μm×310 μm, with gaps of 20 μm was set on the position of R (red) of the dots. Then, said cell was set on the exposure, and an ultraviolet ray was irradiated for 300 seconds with the use of a high-pressure mercury-vapor light of 2 kW (exposure ability: 10 mW/$cm^2$. second) from the opposite surface of ITO (from the upper part).

After that, the substrate was detached from the cell, and washed, drained by a spin drier, and baked for one hour in an oven at 180° C.

Then, in 4 liters of pure water, above FPEG and Heliogen Green L9361 (produced by BASF Co.) were added, and were made into solutions of 2 mM and 15 g/liter, respectively. The solutions were dispersed for 30 minutes by an ultrasonic homogenizer, to be micelle dispersions. Said micelle dispersions were put into the cell, and said substrate on which a thin film of R was formed was set to the cell. The mask was set on the position of G (green) of the dots, subjected to exposure for 300 seconds with a proximity gap of 70 μm in the same manner as above, and subjected to the treatment after film formation in the same way as for R.

A B (blue) film was formed in the same manner as in the film formation of G, except that Heliogen-K-7080 (produced by BASF Co.) in a concentration of 9 g/liter was used in place of Heliogen Green L 9361 in a concentration of 15 g/liter, to obtain a pattered thin film of RGB coloring matters.

Lastly, to 4 liters of pure water, above FPEG and Paliogen Black K 0084 (produced by BASF Co.) were added, to make solutions of 2 mM and 10 g/liter, respectively. Said solutions were dispersed by an ultrasonic homogenizer for 30 minutes, to make micelle dispersions.

Next, the same procedure as above was repeated except that said micelle dispersions were used, and BM mask (open part:310 μm×90 μm, band width:20 μm) was used, to form BM (black matrix) on the substrate on which a pattered thin film of RGB coloring matters was formed.

Accordingly, RGB color filters with black matrix were obtained.

EXAMPLE 9

On ITO substrate of 300 square (blue place glass: 1.1 mm in thickness) produced by sputtering so as to have 50 $\Omega/cm^2$ of face resistance as ITO film, $TiO_2$ thin film was formed by the vacuum deposition method. $TiO_2$ used in vacuum deposition was crystalline anatase with a purity of 99.9% (produced by Wako Junyaku Industry, Co.), and the heat board was made of tangsten and was heated to 1500° C. The film thickness was measured by a film thickness gauge by rock crystal oscilator (CRTIA; produced by ULVAC Co.) to be 1000 Å. The same procedure as in Example 8 was repeated except that $TiO_2$/ITO substrate thus obtained was used, to obtain RGB color filter with black matrix.

EXAMPLE 10

On ITO substrate of 300 square (NA45 glass: 1.1 mm in thickness) produced by sputtering so as to have a face resistance of 400 $\Omega/cm^2$ as ITO film, $TiO_2$ thin film was formed by vacuum deposition method. $TiO_2$ used in vacuum deposition was crystalline rutile with a purity of 99.9% (produced by Wako Junyaku Industry, Co.).

The heat board made of tangsten was heated to 2000° C. The film thickness was measured by quartz vibration-type film-thickness meter (CRTIA: produced by ULVAC Co.) to be 8000 Å. The same procedure as in Example 8 was repeated except that TiO₂/ITO substrate thus obtained was used, to obtain RGB color filter with black matrix.

EXAMPLE 11

On a ITO substrate of 300 square (NA45 glass: 1.1 mm in thickness) produced by sputtering so as to have face resistance of 400 $\Omega/cm^2$ as ITO film, $TiO_2$ thin film was formed by the vacuum deposition method. $TiO_2$ used in vacuum deposition was crystalline anatase of a purity of 99.9% (produced by Wako Junyaku Industry, Co.), and the heat board of tangsten was heated to 1800° C. The film thickness was measured by quartz vibration-type film-thickness meter (CRTIA: produced by ULVAC Co.), to be 3500 Å. The procedure of Example 8 was repeated except that TiO₂/ITO substrate thus obtained was used, to obtain RGB color filter with black matrix.

EXAMPLE 12

On Al substrate of 300 square (NA45 glass: 1.1 mm in thickness) produced by sputtering so as to have 100 $\Omega/cm^2$ of face resistance as Al film, α-Si thin film was formed by the vacuum deposition method. α-Si used in vacuum deposition was α-Si ingot with a purity of 99.9995% (produced by Taiyo Yuden Co.), and the heat board was made of tangsten and was heated to 1500° C. The film thickness was measured by a quartz vibration-type film-thickness meter (CRTIA: produced by ULVAC Co.), to be 1000 Å. The same procedure as in Example 8 was repeated except that α-Si/Al substrate thus obtained was used, to obtain α-Si color filter with black matrix.

EXAMPLE 13

On Al substrate of 300 square (NA45 glass: 1.1 mm in thickness) produced by sputtering so as to have a face resistance of 100 $\Omega/cm^2$ as Al film, α-Si thin film was formed by the vacuum deposition method. CdS used in vacuum deposition was CdS with a purity of 99.5% (produced by Wako Junyaku Industry, Co.). Heating was effected by the use of electron beam (EB). The film thickness was measured by quartz vibration-type film-thickness meter (CRTIA: produced by ULVAC Co.), to be 1000 Å. The same procedure as in Example 8 was repeated except that CdS/Al substrate was used, to obtain RGB color filter with black matrix.

EXAMPLE 14

The procedure of Example 8 was repeated except that a micelle forming agent (FEST9) represented by the formula:

was used as a micelle forming agent of ferrocene derivative, to obtain a RGB color filter with black matrix.

EXAMPLE 15

The procedure of Example 8 was repeated except that 10 mM of micelle forming agent (FTMA) represented by the formula:

was used as a micelle forming agent of ferrocene derivative, to obtain a RGB color filter with black matrix.

EXAMPLE 16

The procedure of Example 8 was repeated except that 10 mM of Brij 35 (nonionic surfactant, produced by KAO Co., Ltd.) was used as a surfactant, to obtain a RGB color filter with black matrix.

EXAMPLE 17

The procedure of Example 8 was repeated except that 12 mM of CTAC (cetyltrimethylammonium chloride) (cationic surfactant, produced by KAO Co., Ltd.) was used as a surfactant, and a RGB color filter with black matrix was obtained.

The physical properties of the color filters formed in Examples 7 to 16 were determined. The results are shown in Table 1.

Transmittance was determined by a spectrophotometer (MCPD-1100, produced by Otsuka electronics Co.), on the bases of the transmittance of a glass substrate. The transmittance value of each RGB was based on 450 nm, 545 nm, and 610 nm.

The black matrix (BM) was evaluated similarly by use of a spectrophotometer, and the minumum value of each wavelength (450 nm to 650 nm) was taken as the absorbance of the BM (BMOD). The larger the value is, is the higher the light shielding property, that is, the performance as BM is higher.

To determine the definition, the border of BM and the color filter (thin film) was polaroided in 200 magnifications by an optical microscope, to measure, on the border, the width of the border where the border comes to be in the same optical density as each bulk of BM and the color filter. The smaller said width is, the higher the definition (contrast) becomes.

The uniformity of the color filter thin films was determined by an electromicroscope. The maximum value of unevenness on the surface of the film was taken from a tomography of 3000 magnefication, and regulated with the average film thickness. The defects were indicated by the number in all picture-elements.

The contrast was determined by the following order. First, to each color filter formed in Examples 7 to 16, 100 ml of acryl-epoxy top coating agent (JSR, 7265A) was applied as the top coating agent, and unified by a spin coater at a revolution number of 1800 rpm. Then, the coating was hardened for 1 hour at 210° C., and polymer of poly ammic acid was spin-coated on the surface. Then the polymer of poly ammic acid was hardened at 250° C. for 1 hours to be polyimide resin, and subjected to rubbing and oriented. As the counter electrode, polymer of poly ammic acid was spin coated on a glass substrate provided with TFT, hardened at 250° C. for 1 hour to be polyimide resin and subjected to rubbing, and glass beads, TN (twist nematic) liquid crystal was put in orderly between the counter electrode and the above-mentioned color filter substrate, to be sealed by an adhesive agent. Thus the panel was accomplished. When a taken-out electrode mounting driver IC was connected to FPC (flexible print circuit), TFT was drived, and the contrast was determined.

EXAMPLES 18 to 28

The same procedure for forming R in Example 8 was repeated except that the electric potential to be applied on TiO$_2$/ITO was changed to −0.5 to 6.0 V, and a thin film of R only was formed. The resulting film was determined for definition in the same manner as above. The results are shown in Table 2.

TABLE 1

| No. | transmittance (%) | | | BMOD (abs) | Definition of Borden ($\mu$m) | Uniformity in Film (%) | Defect (Number/Total) | Contrast |
| --- | --- | --- | --- | --- | --- | --- | --- | --- |
|  | R | G | B |  |  |  |  |  |
| Example 8 | 85 | 85 | 70 | 2.5 | 0.6 | 5 | 15 | 22 |
| Example 9 | 82 | 81 | 74 | 2.5 | 0.7 | 6 | 14 | 40 |
| Example 10 | 81 | 88 | 72 | 2.5 | 0.5 | 5 | 14 | 45 |
| Example 11 | 80 | 78 | 71 | 2.4 | 0.5 | 7 | 18 | 40 |
| Example 12 | 70 | 65 | 68 | 2.2 | 1.2 | 6 | 12 | 25 |
| Example 13 | 75 | 70 | 62 | 2.2 | 1.2 | 5 | 12 | 20 |
| Example 14 | 88 | 82 | 75 | 2.5 | 0.4 | 4 | 10 | 21 |
| Example 15 | 80 | 88 | 73 | 2.5 | 0.5 | 6 | 9 | 33 |
| Example 16 | 75 | 75 | 62 | 2.1 | 1.3 | 8 | 12 | 30 |
| Example 17 | 73 | 73 | 61 | 2.1 | 1.4 | 8 | 14 | 24 |

TABLE 2

| Example No. | Electric Potential (V) | Definition ($\mu$m) | |
| --- | --- | --- | --- |
| Example 18 | 1.0 | 1.9 | Δ |
| Example 19 | 1.2 | 0.6 | ◯ |
| Example 20 | 1.3 | 0.6 | ◯ |
| Example 21 | 1.4 | 0.6 | ◯ |
| Example 22 | 1.5 | 0.5 | ⓒ |
| Example 23 | 1.7 | 0.5 | ⓒ |
| Example 24 | 1.8 | 0.6 | ⓒ |
| Example 25 | 2.0 | 0.5 | ⓒ |
| Example 26 | 2.5 | 0.6 | ◯ |
| Example 27 | 2.8 | 0.7 | ◯ |
| Example 28 | 3.0 | 0.9 | ◯ |

ⓒ : good
◯ : rather good
Δ: rather poor

What is claimed is:

1. A process for producing thin films, which comprises dipping a semiconductive or photoconductive substrate in a micelle solution or dispersion obtained by dispersing or dissolving inorganic substance or hydrophobic organic substance in an aqueous medium in the presence of a surfactant having a HLB value of 10 to 20, irradiating light on the contact interface of said micelle solution or dispersion and said substrate, and thereby forming a thin film of said inorganic substance or hydrophobic organic substance on the said substrate.

2. The process according to claim 1, wherein the surfactant having HLB value of 10 to 20 comprises a ferrocene derivative.

3. The process according to claim 1, wherein the substrate comprises n-type semiconductive or n-type photoconductive substance.

4. The process according to claim 1, wherein the substrate comprises p-type semiconductive or p-type photoconductive substance and a substance to be blocking joint.

5. The process according to claim 4, wherein the substance to be blocking joint comprises ITO plate.

6. The process according to claim 1, wherein the inorganic substance or the hydrophobic organic substance is 10 $\mu$m or smaller in particle diameter.

7. A process for producing thin films, which comprises dipping a semiconductive or photoconductive substrate into a micelle solution or dispersion obtained by dispersing or dissolving an inorganic substance or a hydrophobic organic substance in an aqueous medium in the presence of a surfactant having HLB value of 10 to 20, irradiating lights on the contact interface of said micelle solution or dispersion and said substrate while applying an electric potential of 1.0 to 3.0 V to said substrate, and thereby forming a thin film of said inorganic substance or hydrophobic organic substance on said substrate.

8. The process according to claim 7, wherein the surfactant having HLB value of 10 to 20 is a ferrocene derivative.

9. A process for producing color filters, which comprises dispersing or dissolving pigments or dyes having spectral properties in primary colors of red, green, and blue, each in aqueous medium in the presence of surfactant having HLB value of 10 to 20, to prepare micelle solutions or dispersions of each color, dipping a semiconductive or a photoconductive substrate orderly into said micelle solution or dispersion in each color, irradiating lights of prescribed pattern to the contact interface of said micelle solution or dispersion and the substrate, in each color, while applying an electric potential of 1.0 to 3.0 V to said substrate, and thereby forming color separation filter on said substrate.

10. The process according to claim 9, wherein the surfactant having a HLB value of 10 to 20 is a ferrocene derivative.

* * * * *